(12) United States Patent
Gong

(10) Patent No.: US 11,812,190 B2
(45) Date of Patent: Nov. 7, 2023

(54) INTERFACE ACCESS METHOD, DISPLAY APPARATUS AND ELECTRONIC DEVICE

(71) Applicant: BOE TECHNOLOGY GROUP CO., LTD., Beijing (CN)

(72) Inventor: Weibing Gong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 128 days.

(21) Appl. No.: 17/627,047

(22) PCT Filed: Mar. 11, 2021

(86) PCT No.: PCT/CN2021/080261
§ 371 (c)(1),
(2) Date: Jan. 13, 2022

(87) PCT Pub. No.: WO2021/190319
PCT Pub. Date: Sep. 30, 2021

(65) Prior Publication Data
US 2022/0279143 A1 Sep. 1, 2022

(30) Foreign Application Priority Data

Mar. 24, 2020 (CN) .......................... 202010215293.0

(51) Int. Cl.
H04N 5/44 (2011.01)
H04N 5/445 (2011.01)
G06F 3/16 (2006.01)

(52) U.S. Cl.
CPC ......... H04N 5/44504 (2013.01); G06F 3/165 (2013.01)

(58) Field of Classification Search
None
See application file for complete search history.

(56) References Cited

U.S. PATENT DOCUMENTS

2001/0043284 A1   11/2001   Idegata
2002/0131765 A1   9/2002   DeKeyser et al.
(Continued)

FOREIGN PATENT DOCUMENTS

CN   1737943 A   2/2006
CN   101394508 A   3/2009
(Continued)

OTHER PUBLICATIONS

Office Action dated Nov. 29, 2021 and Search Report dated Nov. 18, 2021, issued in counterpart CN Application No. 202010215293.0, with English machine translation. (12 pages).

*Primary Examiner* — Cai Y Chen
(74) *Attorney, Agent, or Firm* — WHDA, LLP

(57) ABSTRACT

An interface accessing method, a display apparatus, and an electronic device, which relates to the technical field of displaying. The method includes: by the on-screen display board card, when the on-screen display board card receives a viewing instruction of a microphone-volume interface, accessing the interface periodically according to a predetermined accessing mode, wherein the predetermined accessing mode includes, at each of periods, after each time of performance of a first preset time quantity of interface accessing operations to microphone-volume data, performing a second preset time quantity of interface accessing operations to video-channel-access-state data; and by the on-screen display board card, via the interface, reading alternately the microphone-volume data and the video-channel-access-state data from the field-programmable-gate-array board card.

20 Claims, 5 Drawing Sheets

--- by the OSD board card, when the OSD board card receives a viewing instruction of an audio-inputting-device-volume interface, accessing the interface periodically according to a predetermined accessing mode, wherein the predetermined accessing mode comprises, at each of periods, after each time of performance of a first preset time quantity of interface accessing operations to microphone-volume data, performing a second preset time quantity of interface accessing operations to video-channel-access-state data — 101 by the OSD board card, via the interface, reading alternately audio-inputting-device-volume data and video-channel-access-state data from the FPGA board card — 102

(56) References Cited

U.S. PATENT DOCUMENTS

2005/0190609 A1    9/2005   Janssen et al.
2019/0313050 A1   10/2019   Wang et al.
2020/0167113 A1*   5/2020   Chen .................... G06F 13/102

FOREIGN PATENT DOCUMENTS

| | | |
|---|---|---|
| CN | 101640768 A | 2/2010 |
| CN | 102081570 A | 6/2011 |
| CN | 103647901 A | 3/2014 |
| CN | 204258996 U | 4/2015 |
| CN | 107566765 A | 1/2018 |
| CN | 110087006 A | 8/2019 |
| CN | 110798632 A | 2/2020 |
| CN | 111405213 A | 7/2020 |
| WO | 2018112730 A1 | 6/2018 |

* cited by examiner

101 — by the OSD board card, when the OSD board card receives a viewing instruction of an audio-inputting-device-volume interface, accessing the interface periodically according to a predetermined accessing mode, wherein the predetermined accessing mode comprises, at each of periods, after each time of performance of a first preset time quantity of interface accessing operations to audio-inputting-device-volume data, performing a second preset time quantity of interface accessing operations to video-channel-access-state data 102 — by the OSD board card, via the interface, reading alternately audio-inputting-device-volume data and video-channel-access-state data from the FPGA board card 103 — by the FPGA board card, when the FPGA board card detects that a video-channel access state is a preset state, and detects the interface accessing operations to the video-channel-access-state data by the OSD board card, sending the video-channel-access-state data in the preset state to the OSD board card via the interface 104 — by the OSD board card, when the OSD board card receives a displaying instruction of a preset pop-up box, determining a displaying position corresponding to the preset pop-up box 105 — by the OSD board card, acquiring a parameter to be displayed corresponding to the preset pop-up box, and sending the parameter to be displayed and the displaying position to the FPGA board card 106a — by the FPGA board card, according to the parameter to be displayed, generating pop-up-box-displayed data 106b — by the FPGA board card, splicing the pop-up-box-displayed data to the displaying position in a video image to be displayed, to obtain a target video image containing the preset pop-up box 107 — by the FPGA board card, outputting the target video image

FIG. 5

INTERFACE ACCESS METHOD, DISPLAY APPARATUS AND ELECTRONIC DEVICE

CROSS REFERENCE TO RELEVANT APPLICATIONS

The present disclosure claims the priority of the Chinese patent application filed on Mar. 24, 2020 before the Chinese Patent Office with the application number of 202010215293.0 and the title of "INTERFACE ACCESS METHOD, DISPLAY APPARATUS AND ELECTRONIC DEVICE", which is incorporated herein in its entirety by reference.

TECHNICAL FIELD

The present disclosure relates to the technical field of displaying, and particularly relates to an interface accessing method, a display apparatus, and an electronic device.

BACKGROUND

In display apparatuses such as a high-resolution monitor, besides the displayed frame, usually two interfaces may further be displayed, wherein one is an on-screen display (OSD) for exhibiting setting information such as the contrast, and the other is a pop-up box for exhibiting relevant attributes such as the playing volume and the access signal. Both of the OSD interface and the pop-up box are displayed and managed by an OSD application.

Currently, all of the operations for setting the displaying of OSD applications are implemented by the OSD board card sending a command via an interface to a Field-Programmable Gate Array (FPGA) board card. The interface, as a shared device, permits merely one reading or writing operation at a moment. However, in current applications, many of the threads in OSD applications access the interface of the FPGA board card.

SUMMARY

The present disclosure provides an interface accessing method, a display apparatus, and an electronic device.

The present disclosure provides an interface accessing method, wherein the method is applied to a display apparatus, the display apparatus comprises an on-screen display board card and a field-programmable-gate-array board card, the on-screen display board card is connected to the field-programmable-gate-array board card via an interface, and the method comprises:

by the on-screen display board card, when the on-screen display board card receives a viewing instruction of an audio-inputting-device-volume interface, accessing the interface periodically according to a predetermined accessing mode, wherein the predetermined accessing mode comprises, at each of periods, after each time of performance of a first preset time quantity of interface accessing operations to audio-inputting-device-volume data, performing a second preset time quantity of interface accessing operations to video-channel-access-state data; and by the on-screen display board card, via the interface, reading alternately the audio-inputting-device-volume data and the video-channel-access-state data from the field-programmable-gate-array board card.

Optionally, the method further comprises:

by the on-screen display board card, when the on-screen display board card receives an audio setting instruction, via the interface, reading target data instructed by the audio setting instruction from the field-programmable-gate-array board card;

by the on-screen display board card, according to the audio setting instruction, updating the target data, and sending updated target data to the field-programmable-gate-array board card via the interface; and by the field-programmable-gate-array board card, according to the updated target data, generating and outputting a video image containing an audio setting interface.

Optionally, before the step of, via the interface, reading the target data instructed by the audio setting instruction from the field-programmable-gate-array board card, the method further comprises:

by the on-screen display board card, after the on-screen display board card receives the viewing instruction of the audio-inputting-device-volume interface, when the on-screen display board card receives the audio setting instruction, pausing accessing the interface periodically according to the predetermined accessing mode.

Optionally, after the step of, by the on-screen display board card, according to the audio setting instruction, updating the target data, and sending the updated target data to the field-programmable-gate-array board card via the interface, the method further comprises:

before the audio-inputting-device-volume interface is closed, by the on-screen display board card, resuming accessing the interface periodically according to the predetermined accessing mode.

Optionally, the method further comprises:

on the condition that the audio-inputting-device-volume interface is closed, by the on-screen display board card, performing periodically interface accessing operations to the video-channel-access-state data.

Optionally, the method further comprises:

by the field-programmable-gate-array board card, when the field-programmable-gate-array board card detects that a video-channel access state is a preset state, and detects the interface accessing operations to the video-channel-access-state data by the on-screen display board card, sending the video-channel-access-state data in the preset state to the on-screen display board card via the interface.

Optionally, the preset state comprises at least one of a state that each of the video channels has an access signal, a state that none of the video channels has an access signal, a state that each of access-signal formats of the video channels is supported, and a state that none of access-signal formats of the video channels is supported.

Optionally, the method further comprises:

by the on-screen display board card, when the on-screen display board card receives a displaying instruction of a preset pop-up box, determining a displaying position corresponding to the preset pop-up box;

by the on-screen display board card, acquiring a parameter to be displayed corresponding to the preset pop-up box, and sending the parameter to be displayed and the displaying position to the field-programmable-gate-array board card;

by the field-programmable-gate-array board card, according to the parameter to be displayed and the displaying position, obtaining a target video image containing the preset pop-up box; and by the field-programmable-gate-array board card, outputting the target video image.

Optionally, the step of, by the field-programmable-gate-array board card, according to the parameter to be displayed and the displaying position, obtaining the target video image containing the preset pop-up box comprises:

by the field-programmable-gate-array board card, according to the parameter to be displayed, generating pop-up-box-displayed data; and by the field-programmable-gate-array board card, splicing the pop-up-box-displayed data to the displaying position in a video image to be displayed, to obtain the target video image.

Optionally, the preset pop-up box comprises at least one of a video-channel access-state prompting pop-up box and a playing-volume regulating pop-up box.

Optionally, the method further comprises:

by the on-screen display board card, when the on-screen display board card receives the displaying instruction of the preset pop-up box and an on-screen display interface is being displayed, sending a display stopping instruction of the on-screen display interface to the field-programmable-gate-array board card; and by the field-programmable-gate-array board card, when the field-programmable-gate-array board card receives the display stopping instruction, stopping outputting the video image containing the on-screen display interface.

Optionally, the on-screen display interface comprises the audio-inputting-device-volume interface and an audio setting interface.

Optionally, the audio-inputting-device-volume interface is configured for displaying a magnitude of a volume that is collected in real time by an audio inputting device corresponding to at least one accessed video channel, wherein the magnitude of the volume is exhibited by using a sound-column value.

Optionally, before the step of, by the field-programmable-gate-array board card, outputting the target video image, the method further comprises:

according to a pop-up duration required by the preset pop-up box, setting that a delayed displaying duration of the target video image does not exceed the pop-up duration.

The present disclosure further provides a display apparatus, wherein the display apparatus comprises an on-screen display board card and a field-programmable-gate-array board card, the on-screen display board card is connected to the field-programmable-gate-array board card via an interface;

the on-screen display board card is configured for, when the on-screen display board card receives a viewing instruction of an audio-inputting-device-volume interface, accessing the interface periodically according to a predetermined accessing mode, and via the interface, reading alternately audio-inputting-device-volume data and video-channel-access-state data from the field-programmable-gate-array board card, wherein the predetermined accessing mode comprises, at each of periods, after each time of performance of a first preset time quantity of interface accessing operations to audio-inputting-device-volume data, performing a second preset time quantity of interface accessing operations to video-channel-access-state data; and the field-programmable-gate-array board card is configured for, when the field-programmable-gate-array board card detects an access requesting operation to the audio-inputting-device-volume data, sending the audio-inputting-device-volume data to the on-screen display board card, and when the field-programmable-gate-array board card detects an access requesting operation to the video-channel-access-state data, sending the video-channel-access-state data to the on-screen display board card.

Optionally, the interface comprises an inter integrated circuit interface.

Optionally, the display apparatus further comprises a display screen, and the display screen is connected to the field-programmable-gate-array board card.

The present disclosure further provides an electronic device, wherein the electronic device comprises the display apparatus stated above.

In order to solve the above problems, the present disclosure further provides a computing and processing device, wherein the computing and processing device comprises:

a memory storing a computer-readable code; and one or more processors, wherein when the computer-readable code is executed by the one or more processors, the computing and processing device implements the interface accessing method stated above.

In order to solve the above problems, the present disclosure further provides a computer program, wherein the computer program comprises a computer-readable code, and when the computer-readable code is executed on a computing and processing device, the computer-readable code causes the computing and processing device to implement the interface accessing method stated above.

In order to solve the above problems, the present disclosure further provides a computer-readable medium, wherein the computer-readable medium stores the computer program stated above.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

FIG. 5 shows a flow chart of the interface accessing method according to another embodiment of the present disclosure;

DETAILED DESCRIPTION OF THE EMBODIMENTS

In order to make the above purposes, features and advantages of the present disclosure more apparent and understandable, the present disclosure will be described in further detail below with reference to the drawings and the particular embodiments. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
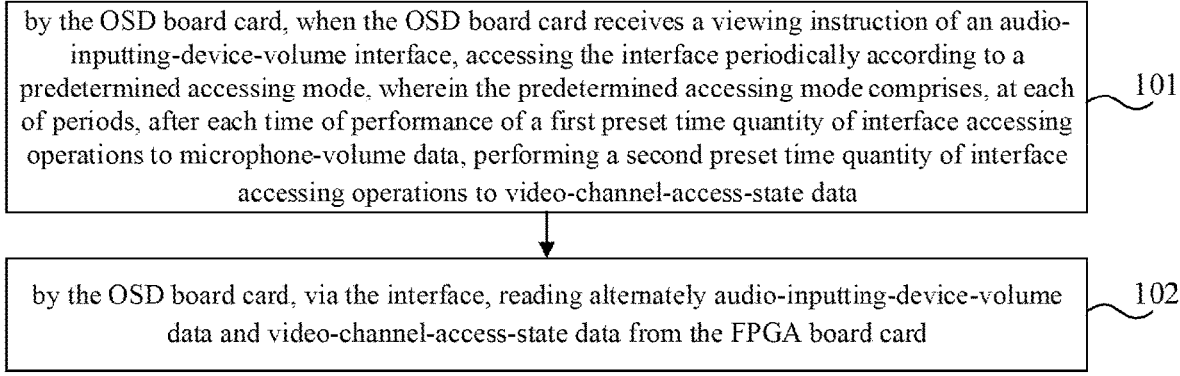
FIG. 1 shows a flow chart of the interface accessing method according to an embodiment of the present disclosure.
Figure 2:
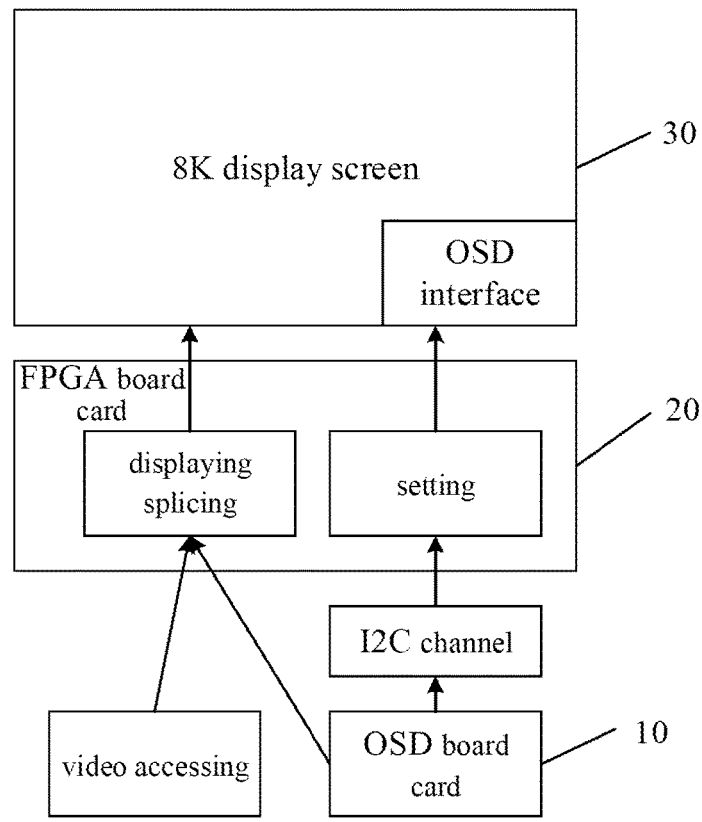
FIG. 2 shows a schematic diagram of the basic structure of the 8K monitor according to an embodiment of the present disclosure.

Referring to FIG. 1, FIG. 1 shows a flow chart of the steps of an interface accessing method according to the present disclosure. The method is applied to a display apparatus, the display apparatus comprises an on-screen display board card (hereinafter referred to for short as an OSD board card) and a field-programmable-gate-array board card (hereinafter referred to for short as a FPGA board card), and the OSD board card is connected to the FPGA board card via an interface. A display apparatus comprising the OSD board card and the FPGA board card that are connected via an interface will be particularly provided below, i.e., an 8K monitor. Referring to FIG. 2, FIG. 2 shows a schematic diagram of the basic structure of an 8K monitor according to the present disclosure. 8K monitors are currently an indispensable display apparatus for realizing ultra-high-definition video playing and live broadcasting.

Referring to FIG. 2, the 8K monitor may comprise an OSD board card 10 and a FPGA board card 20 that are connected via an interface, and an 8K display screen 30, wherein the 8K display screen 30 is also connected to the FPGA board card 20 via an interface. Currently, the displaying mode of the 8K monitor is mainly by splicing 4 channels of 4K video into one 8K video, wherein quick and real-time picture splicing can be realized, and the device for synchronizing the 4 channels is mainly implemented by using the FPGA board card. Moreover, the FPGA board card may further integrate some functions of configuration controlling of the displaying, i.e., for adjusting the OSDs of the 8K monitor, including the color, the mode and the geometrical shape. Because the FPGA has a strong function of calculation as its major characteristic but has poor functions of storage and user interaction, if the operations of the OSDs are to be implemented, the implementation requires an OSD board card for interacting with the user and storing the user data. Moreover, because the FPGA register is very suitable for the access of an inter integrated circuit (I2C) interface, the OSD board card may connect to the FPGA board card via the I2C interface, and realize the OSD controlling on the 8K monitor by sending an instruction containing relevant register addresses and data to the FPGA board card.

The primary functions of the OSD are supported mainly by the FPGA board card. Accordingly, the FPGA board card has three main tasks, wherein the first is to realize the splicing and the synchronous control of different accessed videos; the second is to display the OSD application of the OSD board card on the 8K monitor, and to enable them to coexist with the video displaying; and the third is to receive via the I2C interface the OSD controlling commands from the OSD board card and realize the relevant effects of the 8K monitor, wherein the particular commands include the displaying and disappearance of the OSD, the displaying position of the OSD, the volume regulation, the switching between the video accessing channels, the controlling on the brightness and the color, and so on.

Figure 3:
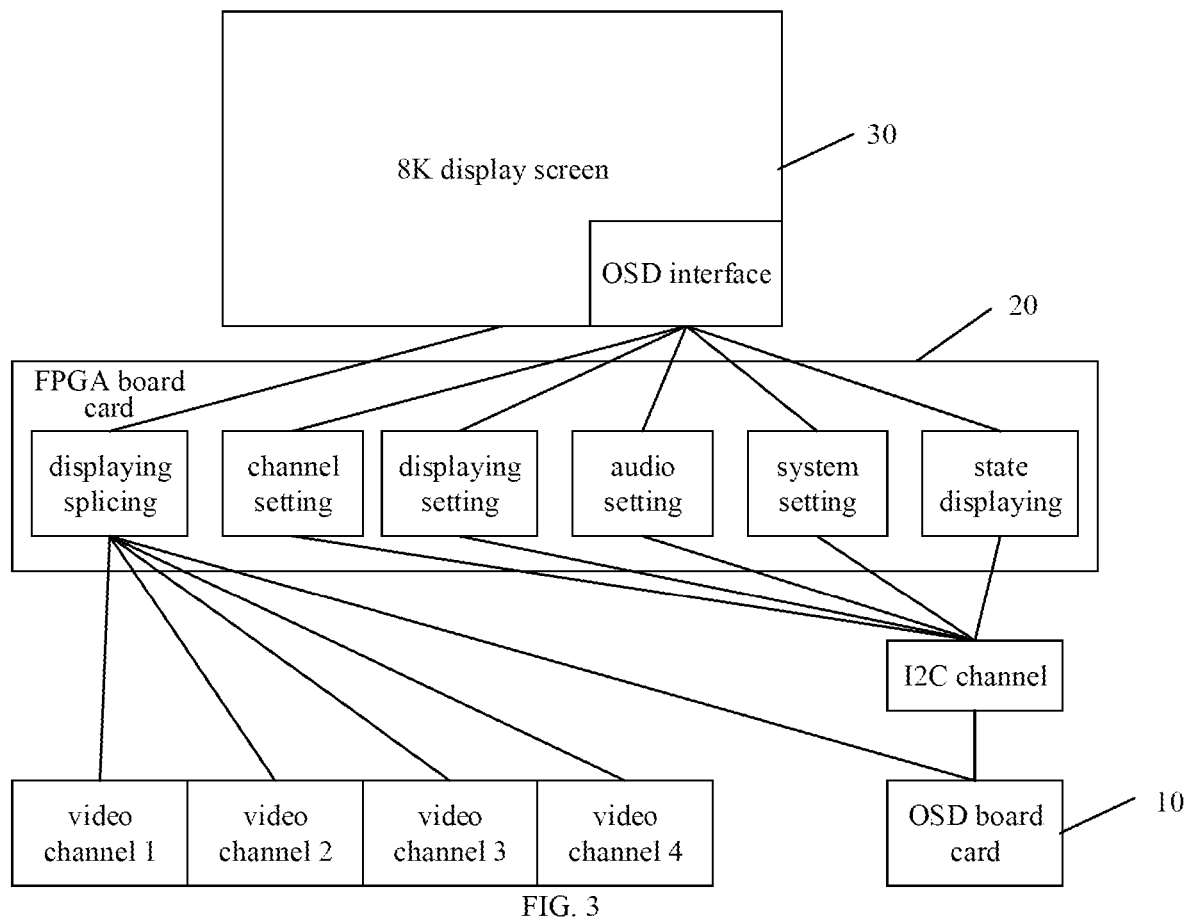
FIG. 3 shows a schematic diagram of the basic function of the 8K monitor according to an embodiment of the present disclosure.

Referring to FIG. 3, FIG. 3 shows a schematic diagram of the basic function of an 8K monitor according to the present disclosure. It supports mainly the setting functions such as channel setting, displaying setting, audio setting, system setting and state displaying. The channel setting mainly realizes the setting related to the video accessing channels, for example, the selection among the video accessing channels and the channel features related to each of the channels, such as image segmentation, color range, transformation matrix and input gamma (GAMMA). The channel selection decides whether the video channel is accessed to a Serial Digital interface (SDI) signal or a High Definition Multimedia interface (HDMI) signal, and whether the signal resolution is 4K or 8K. After different video accessing channels have been selected, when it is playing videos of different resolutions or different accessing channels, it is required to be prompted which video channel is accessed. The displaying setting mainly realizes the settings related to the effect of the video displaying, such as the color temperature, the contrast, the brightness, the hue and the color gamut. The audio setting mainly realizes, for example, sound-track selection, and sound column and volume regulation. The system setting mainly realizes, for example, the setting of the OSD position and the magnitude of the backlight. The state displaying mainly displays in real time the results of some commonly used settings.

The interface accessing method according to the embodiments of the present disclosure may be applied to a display apparatus similar to the above-described 8K monitor. The method comprises the following steps:

Step 101: by the OSD board card, when the OSD board card receives a viewing instruction of an audio-inputting-device-volume interface, accessing the interface periodically according to a predetermined accessing mode, wherein the predetermined accessing mode comprises, at each of periods, after each time of performance of a first preset time quantity of interface accessing operations to audio-inputting-device-volume data, performing a second preset time quantity of interface accessing operations to video-channel-access-state data.

In the embodiments of the present disclosure, optionally, the audio inputting device may be a microphone. The audio-inputting-device-volume interface may display the magnitude of the volume that is collected in real time by the audio inputting device corresponding to at least one accessed video channel, and the magnitude of the volume that is collected in real time by the audio inputting device may be exhibited by using a sound column; in other words, the audio-inputting-device-volume interface may particularly be an audio-inputting-device sound-column interface, and the value of the height of the sound column (hereinafter referred to for short as a sound-column value) may represent the magnitude of the volume that is collected in real time by the audio inputting device. In practical applications, the audio-inputting-device-volume interface is usually triggered by the user manually. Correspondingly, when the user requires to view the audio-inputting-device-volume interface, he may trigger the exhibition of the audio-inputting-device-volume interface by means of a remote controller and so on, whereby the OSD board card can receive the viewing instruction of the audio-inputting-device-volume interface that is triggered by the user. The OSD board card may be used for interacting with the user and storing the user data.

In particular applications, the sound-column value may be obtained by the OSD board card reading a relevant register of the FPGA board card via the interface between the OSD board card and the FPGA board card, and, in order for the effect of real-time exhibition, the sound-column value is required to be read once at least every 100 milliseconds. In practical applications, usually the audio-inputting-device-volume data may be read from the FPGA board card by using a sound-column displaying background thread.

Moreover, in practical applications, the display apparatus may also provide the function of prompting of the video-channel access state in the channel setting, which may be used to prompt the user conditions such as whether the video channel has an access signal, whether the video format is supported and whether the access signal is supported. The function may have two modes, wherein one is that when the user is manually switching the video channel, the prompting may be performed; and the other is that when the user is not manually switching but the video channel changes voluntarily, the prompting may be performed. Regarding the second mode, in practical applications, usually the video-channel-access-state data may be read from the FPGA board card by using a video-channel-access-state prompting background thread.

Therefore, when the OSD board card receives the viewing instruction of the audio-inputting-device-volume interface, both of the sound-column displaying background thread and the video-channel-access-state prompting background thread have the demand on accessing the interface between the OSD board card and the FPGA board card. Therefore, when the OSD board card receives the viewing instruction of the audio-inputting-device-volume interface, it may access the interface periodically according to a predetermined accessing mode, wherein the predetermined accessing mode comprises, at each of periods, after each time of performance of a first preset time quantity of interface accessing operations to audio-inputting-device-volume data, performing a second preset time quantity of interface accessing operations to video-channel-access-state data.

Usually, the data of the sound-column value require to be read and displayed in real time every approximately 100 milliseconds, while the video-channel access state is merely required to be detected and prompted one time every approximately 1 second. In order to realize the serial interface accessing of the two background programs, here a combined thread may be created, wherein the combined thread emerges only when the user is viewing the volume of the audio inputting device. The combined thread can realize the combination between the functions of the sound-column displaying background thread and the video-channel-access-state prompting background thread. In other words, the combined thread can, at each of periods, after each time of performance of M times of the function of the sound-column displaying background thread, perform N times of the function of the video-channel-access-state prompting background thread. In other words, the step of accessing the interface periodically according to the predetermined accessing mode can be implemented by using the combined thread.

T1 is the interval between the performances of the sound-column displaying background thread, and T2 is the interval between the performances of the video-channel-access-state prompting background thread. Optionally, the combined thread may employ the mode in which each time the sound-column value has been read (T2/T1)−1 times, the video-channel access state is read 1 time; in other words, the first preset time quantity may be (T2/T1)−1, and the second preset time quantity may be 1.

Furthermore, regarding the first case of the above-described prompting of the video-channel access state (the user manually switches the video channel), after the channel switching by the user manually pushing the key has been ended, before the prompting of the video-channel access state by using the pop-up boxes, the video-channel-access-state prompting background thread may be firstly paused, and after the video-channel-access-state prompting pop-up box has been displayed, the video-channel-access-state prompting background thread may be restarted. Because the whole process of the switching of the video channel is operated by the user actively, the video-channel-access-state prompting background thread is not required to detect and prompt. Furthermore, it should be noted that, in practical applications, the user cannot operate the two triggering interfaces simultaneously, for example, simultaneously pressing the keys corresponding to the two interfaces. Therefore, the OSD board card, when receives the viewing instruction of the audio-inputting-device-volume interface that is triggered by the user, definitely automatically reads the video-channel-access-state data in the background (by using the combined thread).

Step 102: by the OSD board card, via the interface, reading alternately audio-inputting-device-volume data and video-channel-access-state data from the FPGA board card.

In the embodiments of the present disclosure, the OSD board card, when receives the viewing instruction of the audio-inputting-device-volume interface, may, at each of periods, after each time of performance of M times of interface accessing operations to the audio-inputting-device-volume data, perform N times of interface accessing operations to the video-channel-access-state data, whereby the OSD board card can, via the interface between the OSD board card and the FPGA board card, reading alternately audio-inputting-device-volume data and video-channel-access-state data from the FPGA board card. In other words, after each M times of reading of the audio-inputting-device-volume data, it reads the video-channel-access-state data N times, thereby realizing serial access to the interface, and preventing interface access conflict.

In the embodiments of the present disclosure, the OSD board card of the display apparatus, when receives the viewing instruction of the audio-inputting-device-volume interface that is triggered by the user, may access the interface periodically according to a predetermined accessing mode, wherein the predetermined accessing mode comprises, at each of periods, after each time of performance of a first preset time quantity of interface accessing operations to audio-inputting-device-volume data, performing a second preset time quantity of interface accessing operations to video-channel-access-state data. Subsequently, the OSD board card may, via the interface with the FPGA board card of the display apparatus, read alternately the audio-inputting-device-volume data and the video-channel-access-state data from the FPGA board card, thereby realizing serial access to the interface, preventing interface access conflict, and ensuring the instantaneity of the audio-inputting-device-volume data and the video-channel-access-state data.

Optionally, the method may also comprise the following steps:

by the OSD board card, when the OSD board card receives an audio setting instruction, via the interface, reading target data instructed by the audio setting instruction from the FPGA board card; by the OSD board card, according to the audio setting instruction, updating the target data, and sending updated target data to the FPGA board card via the interface; and by the FPGA board card, according to the updated target data, generating and outputting a video image containing an audio setting interface.

When both of the audio setting interface and the audio-inputting-device-volume interface are closed, the OSD board card may perform periodically interface accessing operations to the video-channel-access-state data. In other words, when both of the audio setting interface and the audio-inputting-device-volume interface are closed, merely the video-channel-access-state prompting background thread has the demand on accessing the interface between the OSD board card and the FPGA board card.

However, in practical applications, the audio-inputting-device-volume interface and the audio setting interface may not be displayed in the same OSD; in other words, the audio-inputting-device-volume interface and the audio setting interface are two different OSD interfaces. In this case, when the OSD board card receives the audio setting instruction and does not receive the viewing instruction of the audio-inputting-device-volume interface, the OSD board card may firstly pause performing periodically interface accessing operations to the video-channel-access-state data. In other words, it firstly pauses the video-channel-access-state prompting background thread, and after the user has completed the audio setting, restarts the video-channel-access-state prompting background thread.

After the video-channel-access-state prompting background thread has been paused, the OSD board card may, via the interface between the OSD board card and the FPGA board card, read the target data instructed by the audio setting instruction from the FPGA board card. If the setting is to switch the sound tracks, then the target data may be the sound-track data. Subsequently, the OSD board card replaces the target data with the latest data instructed by the audio setting instruction, to realize the updating of the target data. Subsequently, the OSD board card may send the updated target data to the FPGA board card via the interface. The FPGA board card, after receiving the data, may, according to the updated target data, generate the audio setting interface, and then splice the audio setting interfaces into a video frame, so as to obtain and output a video image containing the audio setting interface. Accordingly, the user can view the audio setting interface in which the relevant attributes of the audio have been updated.

In other words, after the user has completed the audio setting, the user-audio setting background thread no longer requires to access the interface. Therefore, the OSD board card may resume the video-channel-access-state prompting background thread, and continue to perform periodically interface accessing operations to the video-channel-access-state data.

Figure 4:
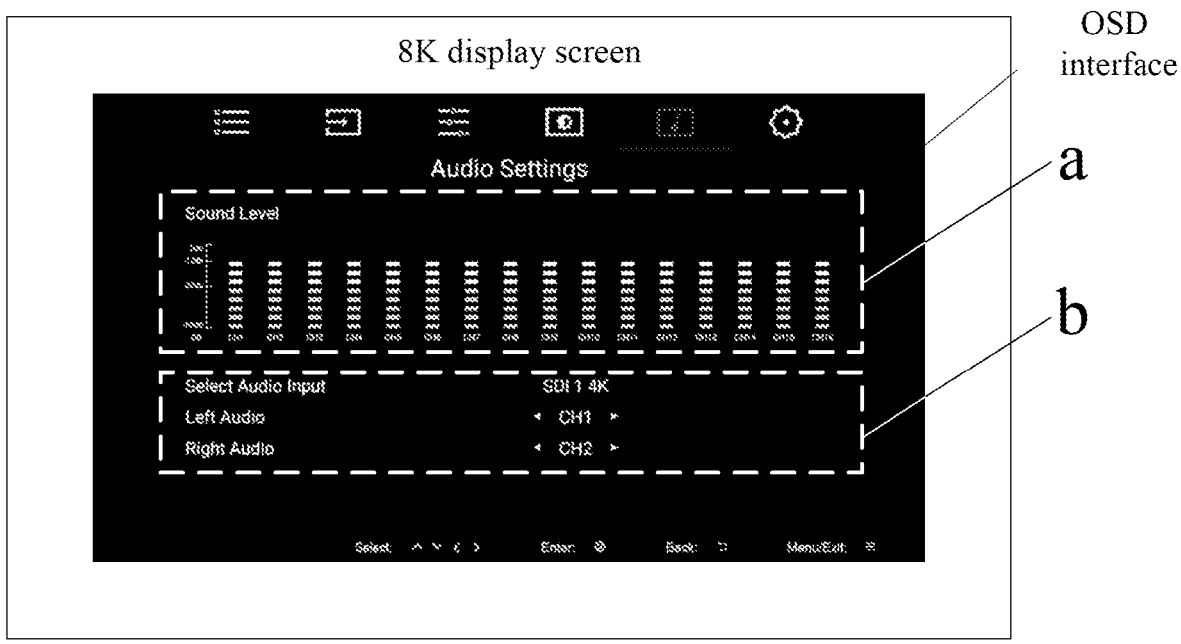
FIG. 4 shows a schematic diagram of an embodiment of the present disclosure in which the audio setting interface and the audio-inputting-device-volume interface are the same OSD interface.

In addition, in practical applications, the volume setting and the audio setting of the audio inputting device may also be displayed in one OSD interface; in other words, the audio-inputting-device-volume interface and the audio setting interface are the same OSD interface, as shown by the OSD interface in FIG. 4. Referring to FIG. 4, the interface region a may be used to display the contents related to the volume of the audio inputting device, for example, the sound columns of the volumes corresponding to the 16 audio inputting channels, and the interface region b may be used to display the contents related to the audio setting, for example, the switching of the left sound track and the switching of the right sound track.

In this case, while the user is viewing the audio-inputting-device-volume interface, he can also view the audio setting interface, and the user can set the audio while the audio-inputting-device-volume interface is being displayed, for example, switching the sound track. Therefore, optionally, before the step of, by the OSD board card, via the interface, reading target data instructed by the audio setting instruction from the FPGA board card, the method may further comprise the following step: by the OSD board card, after the OSD board card receives the viewing instruction of the audio-inputting-device-volume interface, when the on-screen display board card receives the audio setting instruction, pausing accessing the interface periodically according to the predetermined accessing mode.

Because the audio-inputting-device-volume interface and the audio setting interface may be the same OSD interface, before the OSD board card receives the audio setting instruction, the OSD board card definitely receives the viewing instruction of the audio-inputting-device-volume interface. Therefore, after the OSD board card receives the viewing instruction of the audio-inputting-device-volume interface and receives the audio setting instruction triggered by the user, 2 background threads simultaneously have the demand on accessing the interface between the OSD board card and the FPGA board card, i.e., the combined thread and the user-audio setting background thread.

The combined thread emerges only when the user is viewing the sound column, and, at the moment, if the user performs audio setting such as sound-track switching, interface access conflict also happens. However, because the setting operation by the user usually has a higher priority, it is merely required to pause the combined thread when the user-audio setting background thread requires to access the interface, and, after the user has completed the audio setting, restart the combined thread. That is because, according to statistical results, the process of the setting by the user usually accesses the interface at most three times and the accessing duration is approximately tens of milliseconds, and therefore the pausing of the combined thread within such a duration has extremely little real-time affection on the displaying of the volume of the audio inputting device and the prompting of the video-channel access state, and substantially does not affect the user experience.

The OSD board card, when receives the audio setting instruction, may pause accessing the interface periodically according to the predetermined accessing mode, i.e., pausing the combined thread. Subsequently, the OSD board card may, via the interface between the OSD board card and the FPGA board card, read the target data instructed by the audio setting instruction from the FPGA board card. If the setting is to switch the sound tracks, then the target data may be the sound-track data. Subsequently, the OSD board card replaces the target data with the latest data instructed by the audio setting instruction, to realize the updating of the target data. Subsequently, the OSD board card may send the updated target data to the FPGA board card via the interface. The FPGA board card, after receiving the data, may, according to the updated target data, generate the audio setting interface, and then splice the audio setting interfaces into a video frame, so as to obtain and output a video image containing the audio setting interface. Accordingly, the user can view the audio setting interface in which the relevant attributes of the audio have been updated.

Optionally, after the step of, by the OSD board card, according to the audio setting instruction, updating the target data, and sending the updated target data to the FPGA board card via the interface, the method may further comprise the following step: before the audio-inputting-device-volume interface is closed, by the OSD board card, resuming accessing the interface periodically according to the predetermined accessing mode.

In other words, after the user has completed the audio setting, the user-audio setting background thread no longer requires to access the interface. Therefore, before the audio-inputting-device-volume interface has not been closed, the OSD board card may resume the mode of accessing the interface periodically according to the above-described predetermined accessing mode.

Optionally, the method may also comprise the following step: on the condition that the audio-inputting-device-volume interface is closed, by the OSD board card, performing periodically interface accessing operations to the video-channel-access-state data.

On the condition that the audio-inputting-device-volume interface is closed, i.e., when the viewing of the audio-inputting-device-volume interface by the user has been completed, the user no longer requires to view the sound column. At this point, merely the video-channel-access-state prompting background thread has the demand on accessing the interface. Therefore, the OSD board card may perform periodically interface accessing operations to the video-channel-access-state data; in other words, the video-channel-access-state prompting background thread may perform the interface accessing operations.

In practical applications, the closing of the audio-inputting-device-volume interface may be triggered by the user manually, and may also be automatic closing after the audio-inputting-device-volume interface has displayed for a preset duration, which is not limited in the embodiments of the present disclosure.

In addition, as similar to the above-described process of pausing the combined thread in the audio setting by the user, when the user is triggering the other setting interfaces, a case exists that the user-setting background thread and the video-channel-access-state prompting background thread coexist. However, because the duration of the interface accessing required by the user setting is very short, and the user-setting instruction has a higher priority, the method may also be employed in which the video-channel-access-state prompting background thread is paused during the user setting, and the video-channel-access-state prompting background thread is restarted after the user setting has been completed.

Furthermore, because the user may also manually switch the video channel, to trigger the function of the prompting of the video-channel access state, the OSD board card, when receives an instruction of switching the video channel, may also firstly pause performing periodically interface accessing operations to the video-channel-access-state data, and directly perform interface accessing operations to the video-channel-access-state data. In other words, when the OSD board card detects that the user is manually pressing the key to switch the video channel, the OSD board card may firstly pause the video-channel-access-state prompting background thread, to prioritize the user operation, and, after the prompting of the video-channel access state obtained after the switching has been completed, restart the video-channel-access-state prompting background thread.

Optionally, referring to FIG. 5, FIG. 5 shows a flow chart of the steps of another interface accessing method according to the present disclosure. The method may also comprise the following steps:

Step 103: by the FPGA board card, when the FPGA board card detects that a video-channel access state is a preset state, and detects the interface accessing operations to the video-channel-access-state data by the OSD board card, sending the video-channel-access-state data in the preset state to the OSD board card via the interface.

In the embodiments of the present disclosure, regarding the two cases of the manual switching by the user and the automatic switching of the video channel, the display apparatus may provide the function of the prompting of the video-channel access state. The FPGA board card of the display apparatus may create a video-channel-access-state background thread that continuously checks the corresponding information. Particularly, the OSD board card continually sends commands to the FPGA board card via the interface between the OSD board card and the FPGA board card, to determine whether each of the current video channels has a signal, and if it has a signal, and it is further required to detect whether the video-format features of the channel are supported, such as the resolution, the frame rate, the color format and the bit depth. If an 8K video is played, then it is required to simultaneously detect whether the 4 spliced 4K channels have a signal and whether the video format is supported. If a 4K video is played, then it is merely required to detect the signal state and the state of the format supporting of the single current channel. Subsequently, at least one of the three cases may be prompted at a specific displaying position of the screen such as the top right corner of the frame: whether there is a signal, whether the signal is supported and the format features of the supported signal.

The interface accessing operations to the video-channel-access-state data by the OSD board card may, on the condition that the user does not view the volume of the audio inputting device, be performed by the video-channel-access-state background thread, and may also, on the condition that the user views the volume of the audio inputting device, be performed by the combined thread. The FPGA board card, when detects that the video-channel access state has changed into the preset state, and detects the interface accessing operations to the video-channel-access-state data by the OSD board card, may send the video-channel-access-state data that are currently in the preset state to the OSD board card via the interface. Further, the OSD board card may send the video-channel-access-state data in the preset state and the relevant displaying configuration to the FPGA board card. Subsequently, the FPGA board card may, according to the video-channel-access-state data in the preset state and the relevant displaying configuration, generate video-channel-access-state-prompting-pop-up-box displayed data, and splice the video-channel-access-state-prompting-pop-up-box displayed data into the video image to be displayed, to obtain a target video image containing the video-channel access-state prompting pop-up box. Subsequently, the FPGA board card may output the target video image to the display screen, and the display screen may display the target video image, whereby the user can view the video-channel access-state prompting pop-up box.

The video-channel-access-state background thread or the combined thread, when implementing the access prompting, creates two marker variables individually for each of the channels, wherein one is used to record whether the video accessing channel has a signal, and the other is used to record whether the video format of the accessing channel is supported. Because there are multiple video-format features, and as long as one of the format features is not supported, the video cannot be played normally, if any one of the format features is not supported, the video format is collectively marked as not supported. When at least one of the two marker variables changes, the background thread prompts the corresponding state at a specific position of the screen according to circumstances.

For example, when a 4K video is played, because merely one 4K video channel is accessed, it is merely required to detect whether the two marker variables corresponding to the channel, i.e., whether there is a signal and whether the video format is supported, have changed. Firstly, it is checked whether there is a signal. If that is changed from having a signal to not having a signal, then it may be prompted that there is not a signal. If that is changed from not having a signal to having a signal, then it is further checked whether the video format supports the marker variables. If the video format does not support them, then it may be prompted that the format is not supported. If the video format supports them, then the particular video-format information may be prompted. If currently there is a signal, then it is further required to check each time whether the video format of the signal is supported. If that is changed from being supported to being not supported, then a not-supporting prompt may be popped. If that is changed from being not supported to being supported, then a prompt of the currently supported video-format features may be popped.

As another example, when an 8K video is played, 4 channels of 4K video channel are simultaneously accessed, and in this case it is required to simultaneously update the marker variables of the 4 channels, i.e., whether each of the 4 channels has a signal and whether the 4 formats are supported, i.e., totally 8 variables. If an 8K video is required to be played, then all of the 4 channels of the accesses must have a signal, and all of the video formats must be supported. Therefore, when all of the 4 channels have a signal, and all of the 4 channels of video formats are supported, the video-format information may be prompted. On the contrary, the inexistence or existence of the signals may have two cases, one is that none of the channels has a signal, and the other is that not all of the channels have no signal (in other words, at least one of the channels does not have a signal but at least one of the channels has a signal). In addition, the existence of the signals may also have two cases, one is that none of the 4 channels is supported, and the other is that not all of the channels are not supported (in other words, at least one of the channels is not supported but at least one of the channels is supported).

In the embodiments of the present disclosure, based on the above classification of the prompting cases, optionally, the prompting is given and the prompting box popped merely in the cases of totally having a signal, totally not having a signal, being totally supported and being totally not supported, and the cases of not all having no signal and not all being not supported are not prompted. In other words, the preset state may comprise at least one of a state that each of the video channels has an access signal, a state that none of the video channels has an access signal, a state that each of access-signal formats of the video channels is supported, and a state that none of access-signal formats of the video channels is supported.

For example, regarding the playing of an 8K video, if none of the 4 channels of video channel has a signal, then a no-signal prompting box is popped. When all of them have a signal and the video formats are supported, a video-format prompting box is popped to replace the no-signal prompting box. When all of them have a signal and none of the video formats is supported, a not-supporting prompting box is popped to also replace the no-signal prompting box. When not all of them have no signal or not all of them are not supported, the no-signal prompting box is eliminated. If there is no prompting box currently, a prompting box is popped directly according to the above cases. If there is another prompting box currently, also, according to circumstances, a new prompting box is popped to replace the original prompting box. When an 8K video is inputted, as long as one of the channels does not have a signal or has an unsupported video format, that will be obviously seen; for example, the frame in one of the channels of the video that should originally be seen cannot be seen. Therefore, the cases of not all having no signal and not all being not supported can require no obvious prompting. That can avoid excessive prompts, and save the system resource.

Certainly, in particular applications, when any one of the states of any one channel of the video channels of whether it has a signal and whether the video format is supported changes, the video-channel access state may be prompted, which is not limited in the embodiments of the present disclosure.

Optionally, referring to FIG. 5, the method may also comprise the following steps:

Step 104: by the OSD board card, when the OSD board card receives a displaying instruction of a preset pop-up box, determining a displaying position corresponding to the preset pop-up box.

In the embodiments of the present disclosure, optionally, the preset pop-up box may comprise at least one of a video-channel access-state prompting pop-up box and a playing-volume regulating pop-up box.

Figure 6:
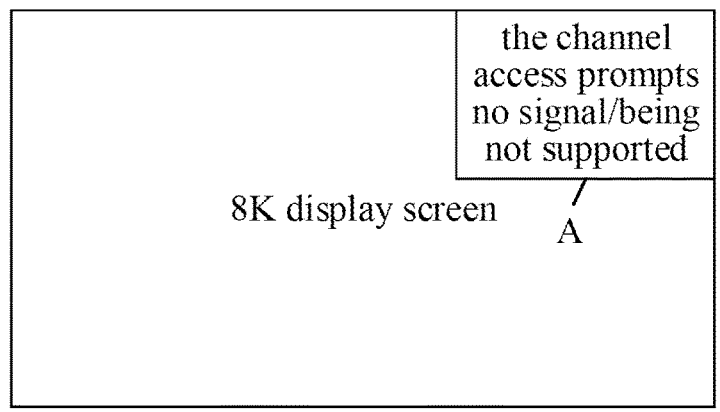
FIG. 6 shows a schematic diagram of the displaying of the video-channel access-state prompting pop-up box according to an embodiment of the present disclosure.
Figure 7:
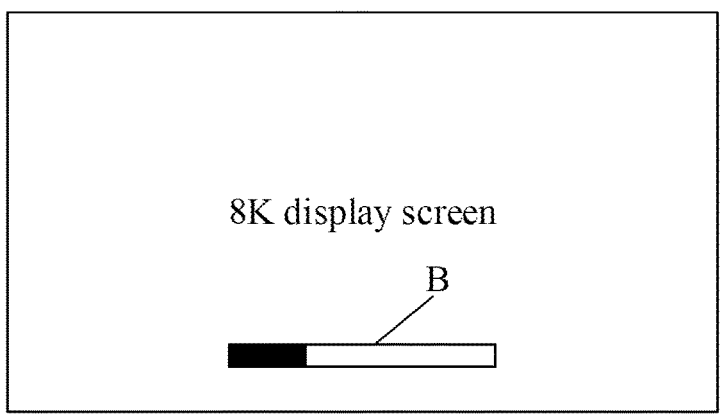
FIG. 7 shows a schematic diagram of the displaying of the playing-volume regulating pop-up box according to an embodiment of the present disclosure.

Regarding the 8K monitor, its displaying source is from the video channel access, the operation of video splicing has an extremely high requirement on the image processing efficiency, and the processing may employ the specialized FPGA image processing scheme. In order to timely display and not display the OSD while an 8K video is being displayed on the monitor, the FPGA board card is required to splice also the OSD into the 8K displaying. The OSD application of the OSD board card does not only have the functions of settings, but also has the functions of the video-channel access-state prompting pop-up box and the playing-volume regulating pop-up box. It should be noted that the two pop-up boxes are also displayed by the OSD application, but are different from the other setting interfaces (collectively referred to as the OSD interface) of the OSD application. In the embodiments of the present disclosure, the two pop-up boxes may be displayed at different positions of the display screen. As shown in FIG. 6, the video-channel access-state prompting pop-up box A may be displayed at the top right corner of the screen. As shown in FIG. 7, the playing-volume regulating pop-up box B may be displayed in the middle of the bottom of the screen.

Particularly, when the OSD board card detects by using the OSD application that the user requires to regulate the playing volume, or requires to be prompted the video-channel access state, the OSD board card may receive the displaying instruction of the preset pop-up box, and, subsequently, may, according to the correspondence relation between the preset pop-up box and the displaying position, determining a displaying position corresponding to the preset pop-up box. The prompting of the video-channel access state may be a prompting triggered by the user voluntarily pressing the key, and may also be a prompting triggered by the automatic detection by a background thread.

Optionally, the method may further comprise the following steps: by the OSD board card, when the OSD board card receives the displaying instruction of the preset pop-up box and an OSD interface is being displayed, sending a display stopping instruction of the OSD interface to the FPGA board card; and by the FPGA board card, when the FPGA board card receives the display stopping instruction, stopping outputting the video image containing the OSD interface.

The OSD interface may comprise the audio-inputting-device-volume interface and the audio setting interface, and, certainly, further comprises another setting interface that is of the nature of a pop-up box.

In other words, when the OSD board card detects that the user requires to regulate the playing volume, or requires to be prompted the video-channel access state, if an OSD interface such as the audio-inputting-device-volume interface is being displayed, then it is required to firstly make the OSD interface disappear. Here, in order to prevent still displaying the OSD interface after the preset pop-up box has been displayed at the corresponding displaying position, both of the processes of the OSD application determining the displaying position and popping the pop-up boxes are required to be performed when the OSD interface is not being displayed, and only after both of those processes have been completed, the video-channel access-state prompting pop-up box or the playing-volume regulating pop-up box can be displayed. Because all of the pop-up boxes and the OSD interface are implemented by the OSD application, merely one of the OSD interface and the pop-up boxes can be displayed at the same moment, merely one of different OSD interfaces can be displayed at the same moment, and merely one of the different pop-up boxes can be displayed at the same moment.

If, when the OSD board card detects that the user requires to regulate the playing volume, or requires to be prompted the video-channel access state, no OSD interface such as the audio-inputting-device-volume interface is being displayed, then the OSD board card may directly determine the displaying position corresponding to the preset pop-up box.

Step 105: by the OSD board card, acquiring a parameter to be displayed corresponding to the preset pop-up box, and sending the parameter to be displayed and the displaying position to the FPGA board card.

When the preset pop-up box is the video-channel access-state prompting pop-up box, the OSD board card may, by using the video-channel-access-state background thread or the combined thread, access the interface with the FPGA board card, thereby reading a parameter to be displayed corresponding to the video-channel access-state prompting pop-up box, for example, the above-described video-channel-access-state data in the preset state. Subsequently, the OSD board card may send to the FPGA board card the parameter to be displayed corresponding to the video-channel access-state prompting pop-up box and the displaying position corresponding to the video-channel access-state prompting pop-up box. Optionally, the displaying position corresponding to the video-channel access-state prompting pop-up box A may be the top right corner of the screen shown in FIG. 6.

When the preset pop-up box is the playing-volume regulating pop-up box, the OSD board card may acquire a parameter to be displayed corresponding to the playing-volume regulating pop-up box of the video channel, for example, the playing volume obtained after the regulation that is instructed by the displaying instruction of the playing-volume regulating pop-up box of the video channel. Subsequently, the OSD board card may send to the FPGA board card the parameter to be displayed corresponding to the playing-volume regulating pop-up box and the displaying position corresponding to the playing-volume regulating pop-up box. Optionally, the displaying position corresponding to the playing-volume regulating pop-up box B may be the middle of the bottom of the screen shown in FIG. 7.

Step 106: by the field-programmable-gate-array board card, according to the parameter to be displayed and the displaying position, obtaining a target video image containing the preset pop-up box.

Particularly, the step 106 may comprise the following steps 106*a* and 106*b*:

Step 106*a*: by the FPGA board card, according to the parameter to be displayed, generating pop-up-box-displayed data.

In this step, the FPGA board card may, according to the parameter to be displayed corresponding to the preset pop-up box, generating pop-up-box-displayed data, for example, according to 30% of the playing volume obtained after the regulation by the playing-volume regulating pop-up box, generating a playing-volume regulating bar shown in FIG. 7.

Step 106*b*: by the FPGA board card, splicing the pop-up-box-displayed data to the displaying position in a video image to be displayed, to obtain the target video image containing the preset pop-up box.

In this step, the FPGA board card may splice the pop-up-box-displayed data corresponding to the preset pop-up box to the displaying position in a video image to be displayed. Particularly, the FPGA board card may perform image matting to the video image to be displayed, wherein the matting position is the displaying position corresponding to the preset pop-up box, and may in turn splice the pop-up-box-displayed data corresponding to the preset pop-up box to the matting position in the video image to be displayed obtained after the image matting, thereby obtaining a target video image containing the preset pop-up box. That can realize displaying different pop-up boxes at different displaying positions.

Step 107: by the FPGA board card, outputting the target video image.

After obtaining the target video image containing the preset pop-up box, the FPGA board card may output the target video image to the display screen, and the display screen may display the target video image, whereby the user can view the preset pop-up box. If the preset pop-up box is required to be displayed within 1 second, then the display apparatus may display the target video image containing the preset pop-up box within a duration with a delay not greater than 1 second.

In the embodiments of the present disclosure, the on-screen display board card of the display apparatus, when receives the viewing instruction of the audio-inputting-device-volume interface that is triggered by the user, may access the interface periodically according to a predetermined accessing mode, wherein the predetermined accessing mode comprises, at each of periods, after each time of performance of a first preset time quantity of interface accessing operations to audio-inputting-device-volume data, performing a second preset time quantity of interface accessing operations to video-channel-access-state data. Subsequently, the on-screen display board card may, via the interface with the field-programmable-gate-array board card of the display apparatus, read alternately the audio-inputting-device-volume data and the video-channel-access-state data from the field-programmable-gate-array board card, thereby realizing serial access to the interface, preventing interface access conflict, and ensuring the instantaneity of the audio-inputting-device-volume data and the video-channel-access-state data. In addition, the display apparatus can realize displaying different pop-up boxes at different displaying positions, and the prompting of particular video-channel access states.

Figure 8:
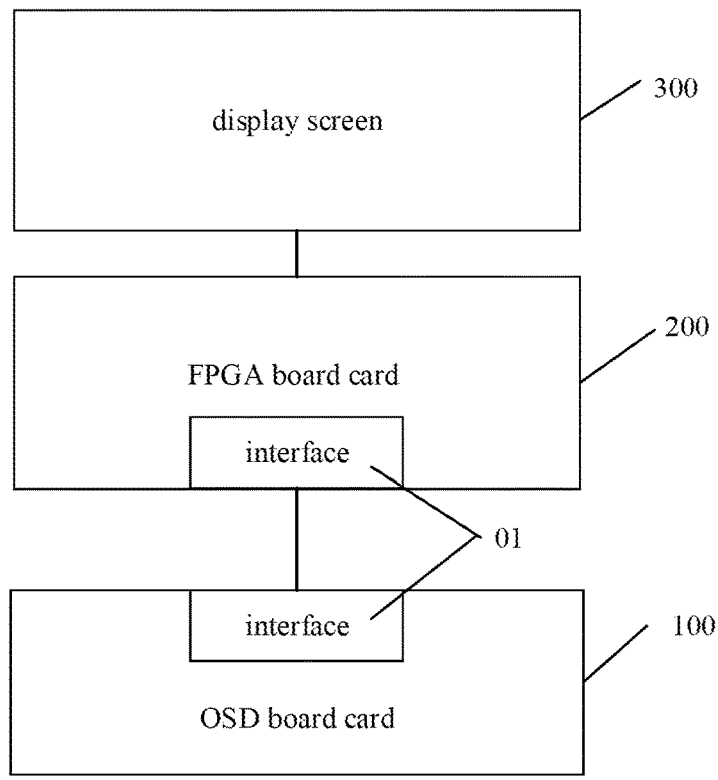
FIG. 8 shows a structural block diagram of the display apparatus according to an embodiment of the present disclosure.

Referring to FIG. 8, FIG. 8 shows a structural block diagram of a display apparatus according to the present disclosure. The display apparatus comprises an on-screen display board card 100 and a field-programmable-gate-array board card 200, and the on-screen display board card 100 is connected to the field-programmable-gate-array board card 200 via an interface 01;

the on-screen display board card 100 is configured for, when the on-screen display board card receives a viewing instruction of an audio-inputting-device-volume interface, accessing the interface periodically according to a predetermined accessing mode, and via the interface, reading alternately audio-inputting-device-volume data and video-channel-access-state data from the field-programmable-gate-array board card 200, wherein the predetermined accessing mode comprises, within each of periods, after each time of performance of a first preset time quantity of interface accessing operations to audio-inputting-device-volume data, performing a second preset time quantity of interface accessing operations to video-channel-access-state data; and the field-programmable-gate-array board card 200 is configured for, when the field-programmable-gate-array board card detects an access requesting operation to the audio-inputting-device-volume data, sending the audio-inputting-device-volume data to the on-screen display board card 100, and when the field-programmable-gate-array board card detects an access requesting operation to the video-channel-access-state data, sending the video-channel-access-state data to the on-screen display board card 100.

Optionally, the interface 01 comprises an inter integrated circuit (I2C) interface.

Optionally, referring to FIG. 8, the display apparatus further comprises a display screen 300, and the display screen 300 is connected to the field-programmable-gate-array board card 200. Particularly, the display screen 300 may be connected to the field-programmable-gate-array board card 200 via a universal interface.

In the embodiments of the present disclosure, the on-screen display board card of the display apparatus, when receives the viewing instruction of the audio-inputting-device-volume interface that is triggered by the user, may access the interface periodically according to a predetermined accessing mode, wherein the predetermined accessing mode comprises, at each of periods, after each time of performance of a first preset time quantity of interface accessing operations to audio-inputting-device-volume data, performing a second preset time quantity of interface accessing operations to video-channel-access-state data. Subsequently, the on-screen display board card may, via the interface with the field-programmable-gate-array board card of the display apparatus, read alternately the audio-inputting-device-volume data and the video-channel-access-state data from the field-programmable-gate-array board card, thereby realizing serial access to the interface, preventing interface access conflict, and ensuring the instantaneity of the audio-inputting-device-volume data and the video-channel-access-state data.

An embodiment of the present disclosure further discloses an electronic device, wherein the electronic device comprises the display apparatus stated above.

In the embodiments of the present disclosure, the on-screen display board card of the display apparatus, when receives the viewing instruction of the audio-inputting-device-volume interface that is triggered by the user, may access the interface periodically according to a predetermined accessing mode, wherein the predetermined accessing mode comprises, within each of periods, after each time of performance of a first preset time quantity of interface accessing operations to audio-inputting-device-volume data, performing a second preset time quantity of interface accessing operations to video-channel-access-state data. Subsequently, the on-screen display board card may, via the interface with the field-programmable-gate-array board card of the display apparatus, read alternately the audio-inputting-device-volume data and the video-channel-access-state data from the field-programmable-gate-array board card, thereby realizing serial access to the interface, preventing interface access conflict, and ensuring the instantaneity of the audio-inputting-device-volume data and the video-channel-access-state data.

Regarding the above-described process embodiments, for brevity of the description, all of them are expressed as the combination of a series of actions, but a person skilled in the art should know that the present disclosure is not limited by the sequences of the actions that are described, because, according to the present disclosure, some of the steps may have other sequences or be performed simultaneously. Secondly, a person skilled in the art should also know that all of the embodiments described in the description are preferable embodiments, and not all of the actions and the modules that they involve are required by the present disclosure.

The above-described device embodiments are merely illustrative, wherein the units that are described as separate components may or may not be physically separate, and the components that are displayed as units may or may not be physical units; in other words, they may be located at the same location, and may also be distributed to a plurality of network units. Some or all of the modules may be selected according to the actual demands to realize the purposes of the solutions of the embodiments. A person skilled in the art can understand and implement the technical solutions without paying creative work.

Each component embodiment of the present disclosure may be implemented by hardware, or by software modules that are operated on one or more processors, or by a combination thereof. A person skilled in the art should understand that some or all of the functions of some or all of the components of the computing and processing device according to the embodiments of the present disclosure may be implemented by using a microprocessor or a digital signal processor (DSP) in practice. The present disclosure may also be implemented as apparatus or device programs (for example, computer programs and computer program products) for implementing part of or the whole of the method described herein. Such programs for implementing the present disclosure may be stored in a computer-readable medium, or may be in the form of one or more signals. Such signals may be downloaded from an Internet website, or provided on a carrier signal, or provided in any other forms.

Figure 9:
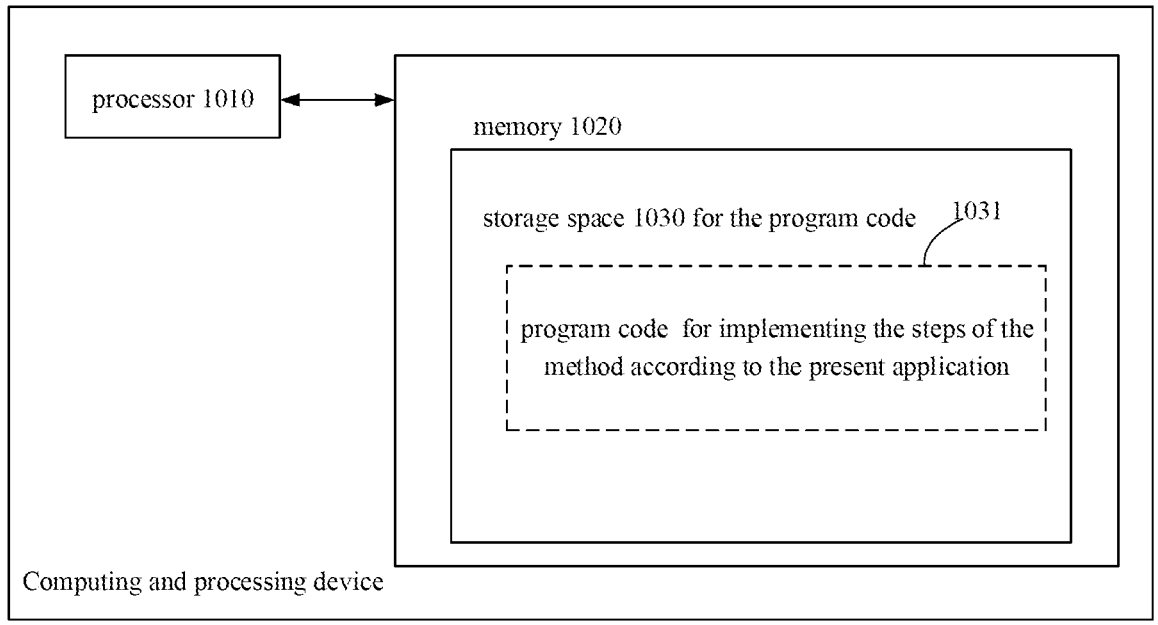
FIG. 9 schematically shows a block diagram of a computing and processing device for implementing the method according to the present disclosure.
Figure 10:
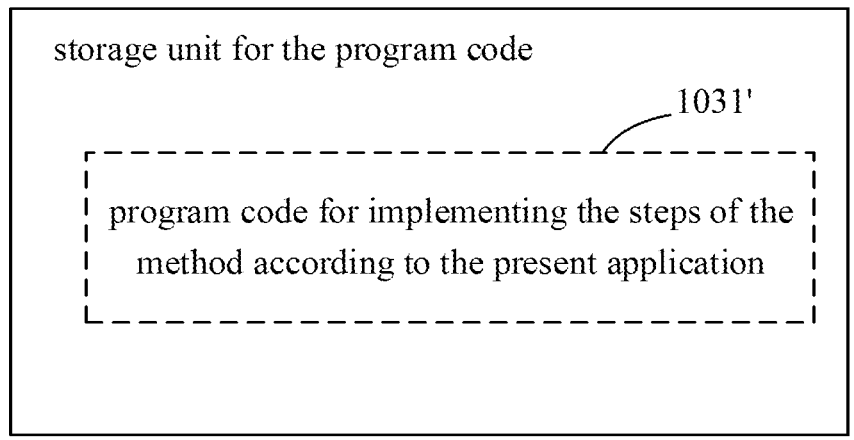
FIG. 10 schematically shows a storage unit for maintaining or carrying a program code for implementing the method according to the present disclosure.

For example, FIG. 9 shows a computing and processing device that can implement the method according to the present disclosure. The computing and processing device traditionally comprises a processor 1010 and a computer program product or computer-readable medium in the form of a memory 1020. The memory 1020 may be electronic memories such as flash memory, EEPROM (Electrically Erasable Programmable Read Only Memory), EPROM, hard disk or ROM. The memory 1020 has the storage space 1030 of the program code 1031 for implementing any steps of the above method. For example, the storage space 1030 for program code may contain program codes 1031 for individually implementing each of the steps of the above method. Those program codes may be read from one or more computer program products or be written into the one or more computer program products. Those computer program products include program code carriers such as a hard disk, a compact disk (CD), a memory card or a floppy disk. Such computer program products are usually portable or fixed storage units as shown in FIG. 10. The storage unit may have storage segments or storage spaces with similar arrangement to the memory 1020 of the computing and processing device in FIG. 9. The program codes may, for example, be compressed in a suitable form. Generally, the storage unit contains a computer-readable code 1031', which can be read by a processor like 1010. When those codes are executed by the computing and processing device, the codes cause the computing and processing device to implement each of the steps of the method described above.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The interface accessing method, the display apparatus and the electronic device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. An interface accessing method, wherein the method is applied to a display apparatus, the display apparatus comprises an on-screen display board card and a field-programmable-gate-array board card, the on-screen display board card is connected to the field-programmable-gate-array board card via an interface, and the method comprises:

by the on-screen display board card, when the on-screen display board card receives a viewing instruction of an audio-inputting-device-volume interface, accessing the interface periodically according to a predetermined accessing mode, wherein the predetermined accessing mode comprises, at each of periods, after each time of performance of a first preset time quantity of interface accessing operations to audio-inputting-device-volume data, performing a second preset time quantity of interface accessing operations to video-channel-access-state data; and by the on-screen display board card, via the interface, reading alternately the audio-inputting-device-volume data and the video-channel-access-state data from the field-programmable-gate-array board card.

2. The method according to claim 1, wherein the method further comprises:

by the on-screen display board card, when the on-screen display board card receives an audio setting instruction, via the interface, reading target data instructed by the audio setting instruction from the field-programmable-gate-array board card;

by the on-screen display board card, according to the audio setting instruction, updating the target data, and sending updated target data to the field-programmable-gate-array board card via the interface; and by the field-programmable-gate-array board card, according to the updated target data, generating and outputting a video image containing an audio setting interface.

3. The method according to claim 2, wherein before the step of, via the interface, reading the target data instructed by the audio setting instruction from the field-programmable-gate-array board card, the method further comprises:

by the on-screen display board card, after the on-screen display board card receives the viewing instruction of the audio-inputting-device-volume interface, when the on-screen display board card receives the audio setting instruction, pausing accessing the interface periodically according to the predetermined accessing mode.

4. The method according to claim 2, wherein after the step of, by the on-screen display board card, according to the audio setting instruction, updating the target data, and sending the updated target data to the field-programmable-gate-array board card via the interface, the method further comprises:

before the audio-inputting-device-volume interface is closed, by the on-screen display board card, resuming accessing the interface periodically according to the predetermined accessing mode.

5. The method according to claim 1, wherein the method further comprises:

on the condition that the audio-inputting-device-volume interface is closed, by the on-screen display board card, performing periodically interface accessing operations to the video-channel-access-state data.

6. The method according to claim 1, wherein the method further comprises:

by the field-programmable-gate-array board card, when the field-programmable-gate-array board card detects that a video-channel access state is a preset state, and detects the interface accessing operations to the video-channel-access-state data by the on-screen display board card, sending the video-channel-access-state data in the preset state to the on-screen display board card via the interface.

7. The method according to claim 6, wherein the preset state comprises at least one of a state that each of the video channels has an access signal, a state that none of the video channels has an access signal, a state that each of access-signal formats of the video channels is supported, and a state that none of access-signal formats of the video channels is supported.

8. The method according to claim 1, wherein the method further comprises:
- by the on-screen display board card, when the on-screen display board card receives a displaying instruction of a preset pop-up box, determining a displaying position corresponding to the preset pop-up box;
- by the on-screen display board card, acquiring a parameter to be displayed corresponding to the preset pop-up box, and sending the parameter to be displayed and the displaying position to the field-programmable-gate-array board card;
- by the field-programmable-gate-array board card, according to the parameter to be displayed and the displaying position, obtaining a target video image containing the preset pop-up box; and
- by the field-programmable-gate-array board card, outputting the target video image.

9. The method according to claim 8, wherein the step of, by the field-programmable-gate-array board card, according to the parameter to be displayed and the displaying position, obtaining the target video image containing the preset pop-up box comprises:
- by the field-programmable-gate-array board card, according to the parameter to be displayed, generating pop-up-box-displayed data; and
- by the field-programmable-gate-array board card, splicing the pop-up-box-displayed data to the displaying position in a video image to be displayed, to obtain the target video image.

10. The method according to claim 8, wherein the preset pop-up box comprises at least one of a video-channel access-state prompting pop-up box and a playing-volume regulating pop-up box.

11. The method according to claim 8, wherein the method further comprises:
- by the on-screen display board card, when the on-screen display board card receives the displaying instruction of the preset pop-up box and an on-screen display interface is being displayed, sending a display stopping instruction of the on-screen display interface to the field-programmable-gate-array board card; and
- by the field-programmable-gate-array board card, when the field-programmable-gate-array board card receives the display stopping instruction, stopping outputting the video image containing the on-screen display interface.

12. The method according to claim 11, wherein the on-screen display interface comprises the audio-inputting-device-volume interface and an audio setting interface.

13. The method according to claim 12, wherein the audio-inputting-device-volume interface is configured for displaying a magnitude of a volume that is collected in real time by an audio inputting device corresponding to at least one accessed video channel, wherein the magnitude of the volume is exhibited by using a sound-column value.

14. The method according to claim 8, wherein before the step of, by the field-programmable-gate-array board card, outputting the target video image, the method further comprises:

according to a pop-up duration required by the preset pop-up box, setting that a delayed displaying duration of the target video image does not exceed the pop-up duration.

15. A display apparatus, wherein the display apparatus comprises an on-screen display board card and a field-programmable-gate-array board card, the on-screen display board card is connected to the field-programmable-gate-array board card via an interface;
- the on-screen display board card is configured for, when the on-screen display board card receives a viewing instruction of an audio-inputting-device-volume interface, accessing the interface periodically according to a predetermined accessing mode, and via the interface, reading alternately audio-inputting-device-volume data and video-channel-access-state data from the field-programmable-gate-array board card, wherein the predetermined accessing mode comprises, at each of periods, after each time of performance of a first preset time quantity of interface accessing operations to audio-inputting-device-volume data, performing a second preset time quantity of interface accessing operations to video-channel-access-state data; and
- the field-programmable-gate-array board card is configured for, when the field-programmable-gate-array board card detects an access requesting operation to the audio-inputting-device-volume data, sending the audio-inputting-device-volume data to the on-screen display board card, and when the field-programmable-gate-array board card detects an access requesting operation to the video-channel-access-state data, sending the video-channel-access-state data to the on-screen display board card.

16. The display apparatus according to claim 15, wherein the interface comprises an inter integrated circuit interface.

17. The display apparatus according to claim 15, wherein the display apparatus further comprises a display screen, and the display screen is connected to the field-programmable-gate-array board card.

18. An electronic device, wherein the electronic device comprises the display apparatus according to claim 15.

19. A computing and processing device, wherein the computing and processing device comprises:
- a memory storing a computer-readable code; and
- one or more processors, wherein when the computer-readable code is executed by the one or more processors, the computing and processing device implements the interface accessing method according to claim 1.

20. A computer program, wherein the computer program comprises a computer-readable code, and when the computer-readable code is executed on a computing and processing device, the computer-readable code causes the computing and processing device to implement the interface accessing method according to claim 1.

* * * * *